(12) United States Patent
Kurita et al.

(10) Patent No.: US 7,656,046 B2
(45) Date of Patent: Feb. 2, 2010

(54) SEMICONDUCTOR DEVICE

(75) Inventors: Yoichiro Kurita, Kanagawa (JP); Koji Soejima, Kanagawa (JP); Masaya Kawano, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 94 days.

(21) Appl. No.: 11/543,207

(22) Filed: Oct. 5, 2006

(65) Prior Publication Data

US 2007/0158837 A1 Jul. 12, 2007

(30) Foreign Application Priority Data

Jul. 10, 2005 (JP) .............................. 2005-294940

(51) Int. Cl.
*H01L 23/28* (2006.01)
(52) U.S. Cl. ........................ 257/787; 361/760; 257/678; 257/666; 257/668; 257/E23.069
(58) Field of Classification Search ................ 257/737, 257/738, E23.021, E23.069, E21.508, 678–733, 257/787–796, E23.001–E23.194
See application file for complete search history.

(56) References Cited

U.S. PATENT DOCUMENTS 5,355,283 A * 10/1994 Marrs et al. ................. 361/760
5,668,405 A * 9/1997 Yamashita ................... 257/668
2005/0252682 A1* 11/2005 Shimoto et al. ............. 174/260

FOREIGN PATENT DOCUMENTS

JP 2001-274202 10/2002

* cited by examiner

*Primary Examiner*—N Drew Richards
*Assistant Examiner*—Swapneel Chhaya
(74) *Attorney, Agent, or Firm*—McGinn IP Law Group, PLLC

(57) ABSTRACT

A semiconductor device 1 is a semiconductor device of the BGA type, and includes a semiconductor chip 10, a resin layer 20, an insulating layer 30, and an external electrode pad 40. The resin layer 20 is constituted by a sealing resin 22 and an underfill resin 24, and covers the semiconductor chip 10. The insulating layer 30 is formed on the resin layer 20. The external electrode pad 40 is formed in the insulating layer 30. This external electrode pad 40 extends through the insulating layer 30. One surface S1 of the external electrode pad 40 is exposed in the surface of the insulating layer 30, and the other surface S2 is located in the resin layer 20. A concave portion 45 is formed in the surface S2 of the external electrode pad 40. The resin composing the resin layer 20 enters into the concave portion 45.

20 Claims, 14 Drawing Sheets

SEMICONDUCTOR DEVICE

This application is based on Japanese Patent application No. 2005-294940, the content of which is incorporated hereinto by reference.

BACKGROUND

1. Technical Field

The present invention relates to a semiconductor device.

2. Related Art

There is described a conventional semiconductor device in, for example, Japanese Laid-open patent publication No. 2001-274202. The semiconductor device described in the document is a semiconductor device of the Ball Grid Array (BGA) type. In this semiconductor device, an external electrode pad 101 and a bonding lead 102 are formed as a part of an interconnect pattern 103 as shown in FIG. 14. On the external electrode pad 101, a solder ball 104 is formed as an external electrode terminal of the semiconductor device. Moreover, a semiconductor chip 106 is connected to the bonding lead 102 through bonding wire 105. This semiconductor chip 106 is covered with sealing resin 107.

SUMMARY OF THE INVENTION

However, as the external electrode pad 101 is formed with a metal such as Cu, the pad 101 has low adhesive properties to the sealing resin 107. Accordingly, there are some cases in which peeling-off is caused on the interface between the external electrode pad 101 and the sealing resin 107 in the semiconductor device shown in FIG. 14, when a mechanical stress caused by falling and the like, or a heat stress is exerted onto the solder ball 104 after the device is implemented on an implementation substrate such as a motherboard.

According to the present invention, there is provided a semiconductor device, comprising a semiconductor chip; a resin layer covering the semiconductor chip; an insulating layer provided on the resin layer; and an external electrode pad, provided so as to extend through the insulating layer, and having one surface which is exposed in a surface of the insulating layer and to which an external electrode terminal is to be connected, wherein a concave portion is provided in the other surface of the external electrode pad, and a resin composing the resin layer enters into the concave portion.

The concave portion is provided in the other surface of the external electrode pad in this semiconductor device. And, the resin composing the resin layer enters into the concave portion. Thereby, as the external electrode pad and the resin layer are configured to engage with each other, there is hardly caused peeling off on the interface between the external electrode pad and the resin layer, in comparison with a case in which the above other surface of the external electrode pad is flat.

According to the present invention, there is provided a semiconductor device with excellent reliability in junction between an external electrode pad and a resin layer.

BRIEF DESCRIPTION OF THE DRAWINGS

The above and other objects, advantages and features of the present invention will be more apparent from the following description taken in conjunction with the accompanying drawings, in which.

DETAILED DESCRIPTION

Figure 1:
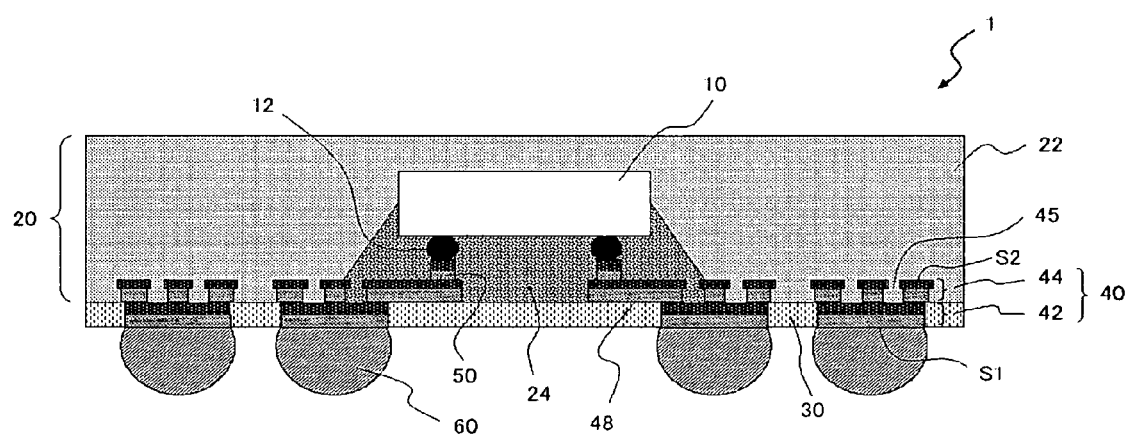
FIG. 1 is a cross-sectional view showing a semiconductor device according to the first embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, preferable embodiments of a semiconductor device according to the present invention will be explained in detail, referring to drawings. Here, in explanation of the drawings, components similar to those all in the drawings are denoted by the same reference numerals, and description will not be repeated.

First Embodiment

FIG. 1 is across-sectional view showing a semiconductor device according to the first embodiment of the present invention. A semiconductor device 1 is a semiconductor device of the BGA type, and has a semiconductor chip 10, a resin layer 20, an insulating layer 30, and an external electrode pad 40. The resin layer 20 is constituted by a sealing resin 22 and an underfill resin 24, and covers the semiconductor chip 10. Here, though an example in which all the surfaces of the semiconductor chip 10 are covered with the resin layer 20 is illustrated in the drawing, the upper surface (a surface which is opposite to the surface provided with a electrode terminal 12) of the semiconductor chip 10 is not required to be covered with the resin layer 20. That is, the upper surface of the semiconductor chip 10 may be exposed in the surface of the resin layer 20.

The insulating layer 30 is formed on the resin layer 20. A resin composing the insulating layer 30 is, for example, a polyimide resin. The external electrode pad 40 is formed in the insulating layer 30. This external electrode pad 40 extends through the insulating layer 30. One surface S1 of the external electrode pad 40 is exposed in the surface of the insulating layer 30, and the other surface S2 is located inside the resin layer 20. A concave portion 45 is formed in the surface S2 of the external electrode pad 40. The resin (the sealing resin 22 and the underfill resin 24 in the present embodiment) composing the resin layer 20 enters into this concave portion 45.

Specifically, the external electrode pad 40 is constituted by a lower pad metal layer 42 (first conductor pattern), and an upper pad metal layer 44 (second conductor pattern). These lower pad metal layer 42 and upper pad metal layer 44 are formed in the insulating layer 30 and the resin layer 20, respectively. It is found from FIG. 1 that almost all side surfaces of the lower pad metal layer 42 is covered with the insulating layer 30, and almost all the surface (equal to the surface S1 of the external electrode pad 40), which is opposite to the upper pad metal layer 44, is exposed in the surface of the insulating layer 30. Moreover, the above-described concave portion 45 is formed in the upper pad metal layer 44, out of the lower pad metal layer 42 and the upper pad metal layer 44. The depth of the concave portion 45 is approximately equal to the thickness of the upper pad metal layer 44.

An interconnect 48 is formed in a layer which is the same one as the upper pad metal layer 44. This interconnect 48 is connected to the upper pad metal layer 44. Moreover, an electrode bump 50 is formed on a part of the interconnect 48. This electrode bump 50 is connected to the electrode terminal 12 in the semiconductor chip 10. The electrode terminal 12 is, for example, a solder bump. However, the electrode terminal 12 may be constituted by a base composed of a metal such as Cu, and a solder layer formed on the base. In such a case, the solder layer is connected to the electrode bump 50. Furthermore, on the surface S1 of the external electrode pad 40, a solder bump 60 is formed as an external electrode terminal of the semiconductor device 1.

Figure 2:
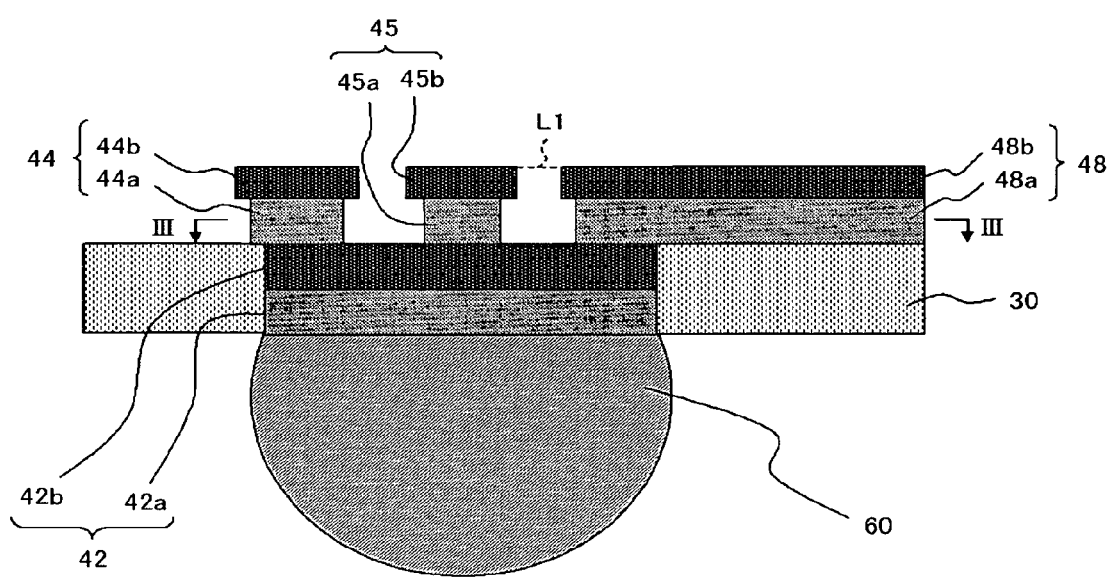
FIG. 2 is a cross-sectional view showing a part of the semiconductor device shown in FIG. 1.

The configuration of the external electrode pad 40 will be more specifically explained, referring to FIG. 2. The drawing is a cross-sectional view showing a part of the semiconductor device 1. The above lower pad metal layer 42 has a multilayer structure including a plurality of metal layers which are different from each other. In the present embodiment, this multilayer structure is composed of a Cu layer 42$a$, and a Ni layer 42$b$ formed on the surface of the Cu layer 42$a$, which is facing the upper pad metal layer 44.

Similarly, the upper pad metal layer 44 also has a multilayer structure including a plurality of metal layers which are different from each other. In the present embodiment, this multilayer structure is composed of a Cu layer 44$a$ (first metal layer), and a Ni layer 44$b$ (second metal layer) formed on the surface of the Cu layer 44$a$, which is facing the lower pad metal 42. An opening 45$a$ (first opening) is formed in the Cu layer 44$a$, and an opening 45$b$ (second opening) is formed in the Ni layer 44$b$. These openings 45$a$, 45$b$ are continuously provided to form the concave portion 45. Here, the opening area of the opening 45$a$ is larger than that of the opening 45$b$. In other words, the Ni layer 44$b$ is configured to overhang the Cu layer 44$a$. Thereby, the opening area (shown by the dotted line L1 in FIG. 2) of the concave portion 45 is smaller than the bottom area of the concave portion 45.

Moreover, the interconnect 48 also has a similar multilayer structure to that of the upper pad metal layer 44, that is, a multilayer structure composed of the Cu layer 48$a$ and the Ni layer 48$b$.

One example of the planer layouts of the concave portion 45 will be explained, referring to FIG. 3. This drawing shows a plan view taken along the line III-III in FIG. 2. In this embodiment, a plural (four in the present example) of the concave portions 45 is provided per one upper pad metal layer 44 (external electrode pad 40). The concave portions 45 are regularly (in the form of diagonal lattice in the present example) arranged in a plan view. Moreover, all the concave portions 45 have a rectangular shape.

Figure 4A:
FIGS. 4A and 4B are cross-sectional views showing a process in one example of methods of manufacturing the semiconductor shown in FIG. 1.
Figure 4B:
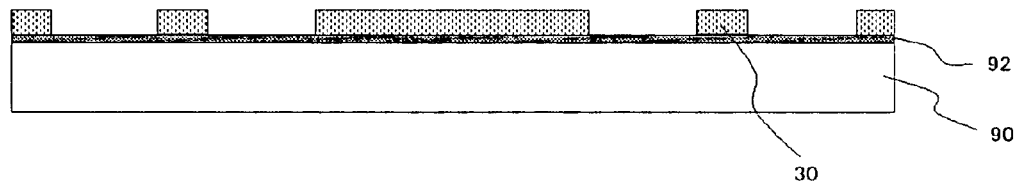

One example of methods of manufacturing the semiconductor device 1 will be explained, referring to FIGS. 4A to FIG. 8. In the first place, on a silicon wafer 90 which is a support substrate, a Cu film 92 is formed as an intervening layer by the sputtering method and the like (FIG. 4A). Subsequently, the insulating layer 30 composed of polyimide resin and the like is formed on the Cu film 92. At this time, in the insulating layer 30, an opening is made at a portion in which the lower pad metal layer 42 is to be provided (FIG. 4B). Here, the insulating layer 30 as patterned above can be formed at low cost by using photosensitive resin as resin composing the insulating layer 30.

Figure 5A:
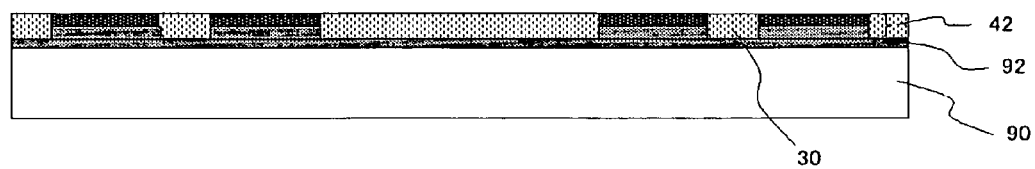
FIGS. 5A and 5B are cross-sectional views showing a process in one example of methods of manufacturing the semiconductor shown in FIG. 1.
Figure 5B:
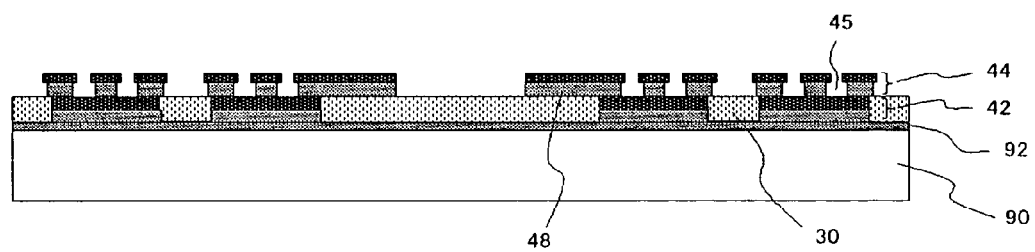

Then, the lower pad metal layer 42 is formed in the above opening in the insulating layer 30 by a plating method in which the Cu film 92 is used as a seed layer (FIG. 5A) Subsequently, the upper pad metal layer 44 and the interconnect 48 are formed by a semi-additive method (FIG. 5B). Specifically, a metal film of Ti, Cu, and the like is formed on the insulating layer 30, on which the lower pad metal layer 42 has been formed, by the sputtering method, and photoresist is applied thereon for patterning. Then, the upper pad metal layer 44 and the interconnect 48 are formed in the opening of the photoresist by the plating method. Subsequently, the photoresist is removed, and the sputtered film is etched. At this time, the structure in which the Ni layer 44$b$ overhangs the Cu layer 44$a$ may be easily realized by selecting an etchant so that the side etching of the Cu layer 44$a$ composing the upper pad metal layer 44 (refer to FIG. 2) is performed.

Figure 6A:
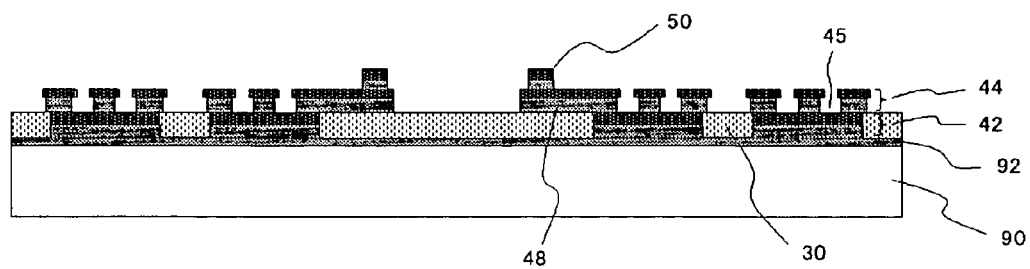
FIGS. 6A and 6B are cross-sectional views showing a process in one example of methods of manufacturing the semiconductor shown in FIG. 1.
Figure 6B:
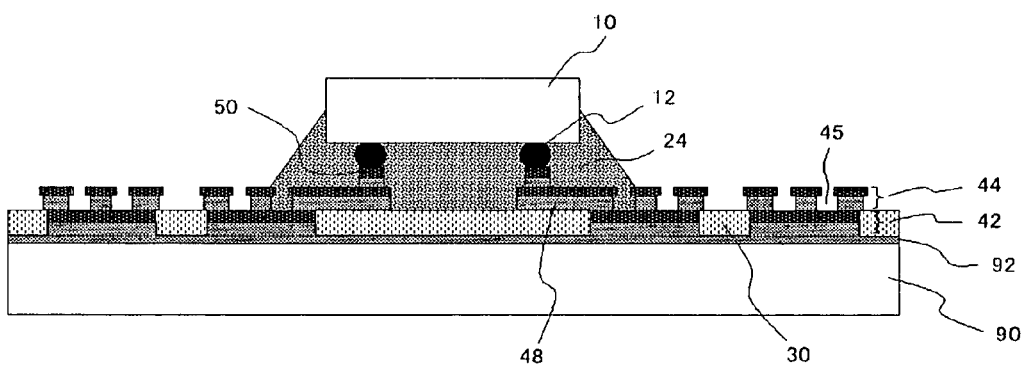

Then, the electrode bump 50 connected to the electrode terminal 12 of the semiconductor chip 10 is formed on a part of the interconnect 48 (FIG. 6A). Subsequently, the electrode terminal 12 of the semiconductor chip 10 is connected to the electrode bump 50. Thereafter, a connecting portion therebetween is sealed with resin by injecting the underfill resin 24 to a gap between the semiconductor chip 10 and the insulating layer 30 (FIG. 6B) At this time, the underfill resin 24 also enters into the inside of the concave portion 45 of the upper pad metal layer 44.

Figure 7A:
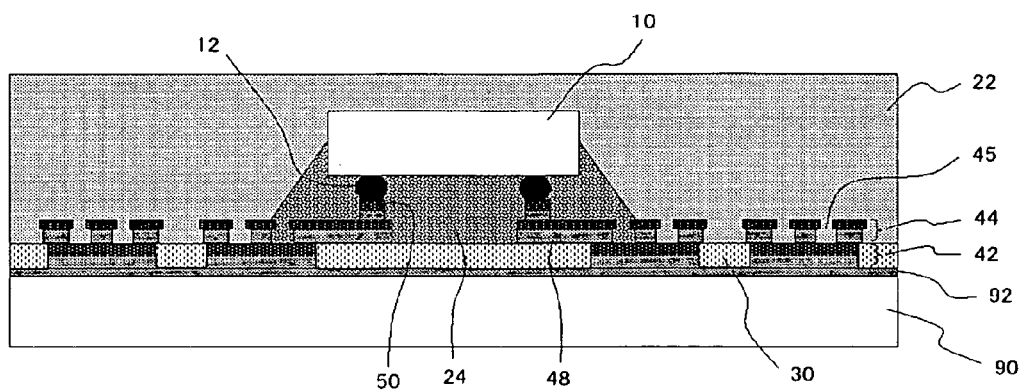
FIGS. 7A and 7B are cross-sectional views showing a process in one example of methods of manufacturing the semiconductor shown in FIG. 1.
Figure 7B:
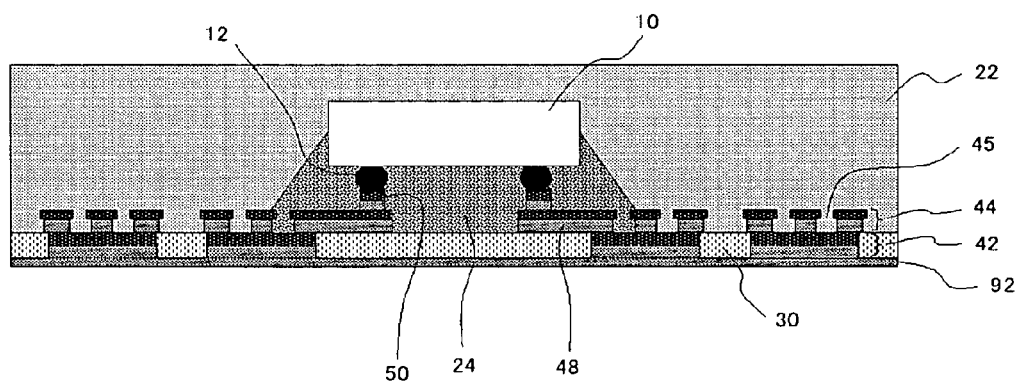
Figure 8:
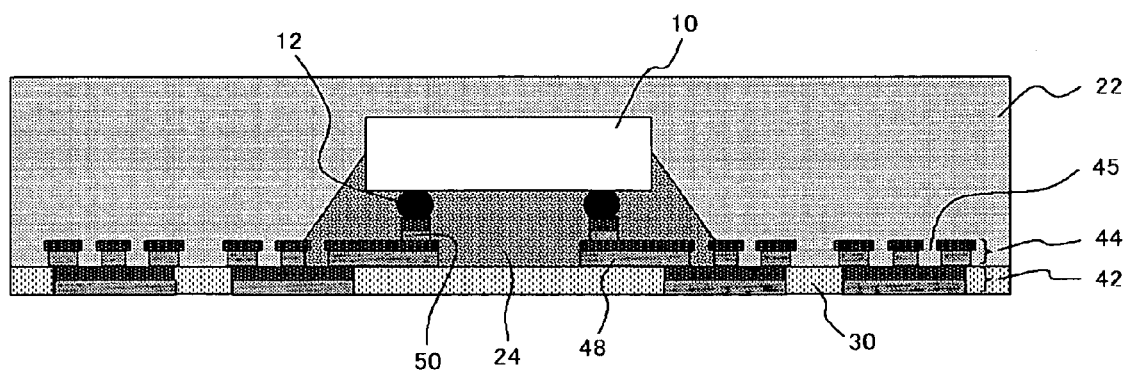
FIG. 8 is a cross-sectional view showing a process in one example of methods of manufacturing the semiconductor shown in FIG. 1.

In addition, the sealing resin 22 is formed on the insulating layer 30 by a transfer molding method, a printing method, a potting method and the like, so as to cover the semiconductor chip 10 (FIG. 7A). At this time, the sealing resin 22 is formed in the concave portion 45 in the same manner as that of the underfill resin 24. Thereafter, the silicon wafer 90 is removed (FIG. 7B). Subsequently, the Cu film 92 is removed by etching (FIG. 8). Furthermore, the semiconductor device 1 shown in FIG. 1 is obtained by connecting the solder bump 60 onto the lower pad metal layer 42.

The effect of the semiconductor device 1 will be explained. In the semiconductor device 1, the concave portion 45 is provided on the surface S2 of the external electrode pad 40. And, the resin composing the resin layer 20 enters into the concave portion 45. Thereby, as the external electrode pad 40 and the resin layer 20 are configured to engage with each other, there is hardly caused peeling off on the interface between the external electrode pad 40 and the resin layer 20, in comparison with a case in which the above surface S2 of the external electrode pad 40 is flat. Therefore, the semiconductor device 1 with excellent reliability in junction between the external electrode pad 40 and the resin layer 20 may be realized. Even when this semiconductor device 1 is implemented on an implementation substrate such as a motherboard, high reliability in connection between the implementation substrate and the device 1 may be obtained.

The external electrode pad 40 includes the lower pad metal layer 42 provided in the insulating layer 30, and the upper pad metal layer 44 provided in the resin layer 20, and the above concave portion 45 is provided in the upper pad metal layer 44. Thereby, the external electrode pad 40 in which the concave portion 45 is provided on the side of the resin layer 20 may be easily manufactured.

The depth of the concave portion 45 is approximately equal to the thickness of the upper pad metal layer 44. Such concave portion 45 may be easily manufactured because it is possible to form the portion 45 by patterning of the upper pad metal layer 44.

The upper pad metal layer 44 has a multilayer structure including a plurality of metal layers which are different from each other. Thereby, a structure in which an upper metal layer which is located at a comparatively upper position overhangs a lower metal layer which is located at a comparatively lower position may be easily achieved. Actually, in this embodiment, the upper pad metal layer 44 has the multilayer structure of the Cu layer 44a and the Ni layer 44b, and the Ni layer 44b overhangs the Cu layer 44a as explained in FIG. 2. According to the above structure, there is further hardly caused peeling off on the interface between the external electrode pad 40 and the resin layer 20 by an anchor effect.

The lower pad metal layer 42 has a multilayer structure of the Cu layer 42a and the Ni layer 42b. As the Cu layer 42a is provided on the side which is connected to the solder bump 60, high adhesive properties between the lower pad metal layer 42 and the solder bump 60 can be obtained. Moreover, the Ni layer 42b can function as a barrier metal. Furthermore, the Ni layer 42b can be prevented from being deposited by an alloy formed between the Cu layer 42a and solder forming the solder bump 60.

Almost all the side surface of the lower pad metal layer 42 is covered with the insulating layer 30, and almost all the surface (the surface S1 in FIG. 1), which is opposite to the upper pad metal layer 44, is exposed in the surface of the insulating layer 30. Thereby, a suitable structure in which solder bumps 60 are provided at a fine pitch can be realized because the solder bumps 60 can be connected to the whole surface S1.

Incidentally, when only a part of the above surface S1 is exposed, and the remaining part is covered with the insulating layer, there may be applied a configuration in which the external electrode pad 40 is supported by the insulating layer. On the other hand, when the whole surface S1 is exposed as described in this embodiment, adhesive properties between the external electrode pad 40 and the resin layer 20 are more strongly required because there is no support which has been described. Therefore, the semiconductor device 1 with excellent reliability in junction between the external electrode pad 40 and the resin layer 20 may become much more useful.

A plurality of concave portions 45 are provided in one external electrode pad 40. Thereby, the reliability in junction between the external electrode pad 40 and the resin layer 20 is further improved. Moreover, as the plurality of the concave portions 45 are regularly arranged in a plan view, the concave portions 45 can be easily formed by patterning of the upper pad metal layer 44.

Second Embodiment

Figure 9:
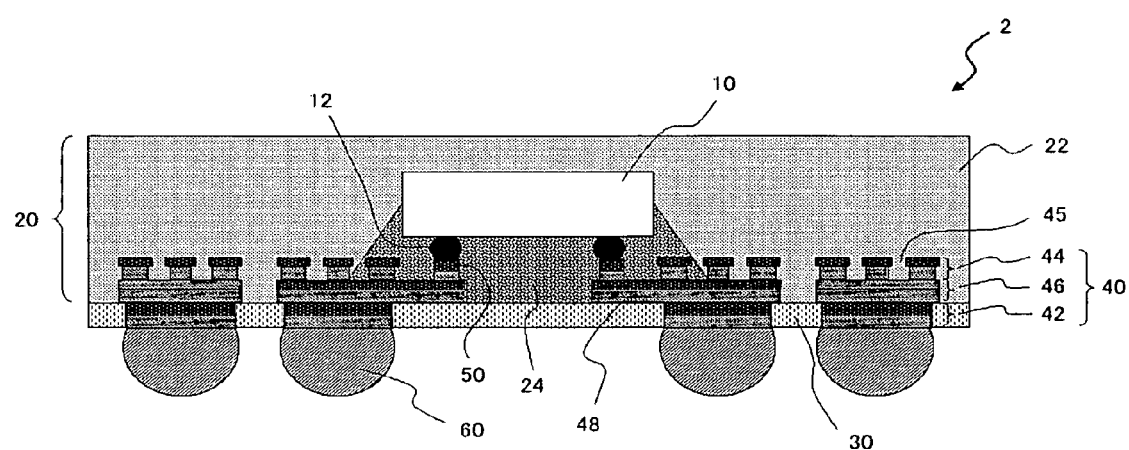
FIG. 9 is a cross-sectional view showing a semiconductor device according to the second embodiment of the present invention.

FIG. 9 is a cross-sectional view showing a semiconductor device according to the second embodiment of the present invention. The semiconductor device 2 is a semiconductor device of the BGA type, and has a semiconductor chip 10, a resin layer 20, an insulating layer 30, and an external electrode pad 40. Among the above components, each of the semiconductor chip 10, the resin layer 20 and the insulating layer 30 has the same configuration as that of the corresponding component in the semiconductor device 1 which has been explained. The semiconductor device 2 and the semiconductor device 1 are different from each other in the configuration of the external electrode pad 40.

The external electrode pad 40 has, in addition to the lower pad metal layer 42 and the upper pad metal layer 44 which are described above, an intermediate pad metal layer 46 (third conductor pattern) provided therebetween. This intermediate pad metal layer 46 is formed in the resin layer 20. An interconnect 48 in this embodiment is formed in the same layer as the intermediate pad metal layer 46. Accordingly, an electrode bump 50 is formed in the same layer as the upper pad metal layer 44.

The semiconductor device 2 with the above configuration has the following effect, in addition to the above effect obtained by the semiconductor device 1. That is, the external electrode pad 40 is hardly deformed even under mechanical stress because the intermediate pad metal layer 46 is intervened between the lower pad metal layer 42 and the upper pad metal layer 44 to increase the whole thickness of the external electrode pad 40. The above effect contributes to improvement of the reliability of the semiconductor device 2.

The semiconductor device according to the present invention is not limited to the above embodiments, and various kinds of variations and modifications may be possible. For example, a configuration in which only one of the sealing resin 22 and the underfill resin 24 enters into the concave portion 45 may be applied, though the configuration in which both the sealing resin 22 and the underfill resin 24 enter into the concave portion 45 has been illustrated in the above embodiments.

Figure 3:
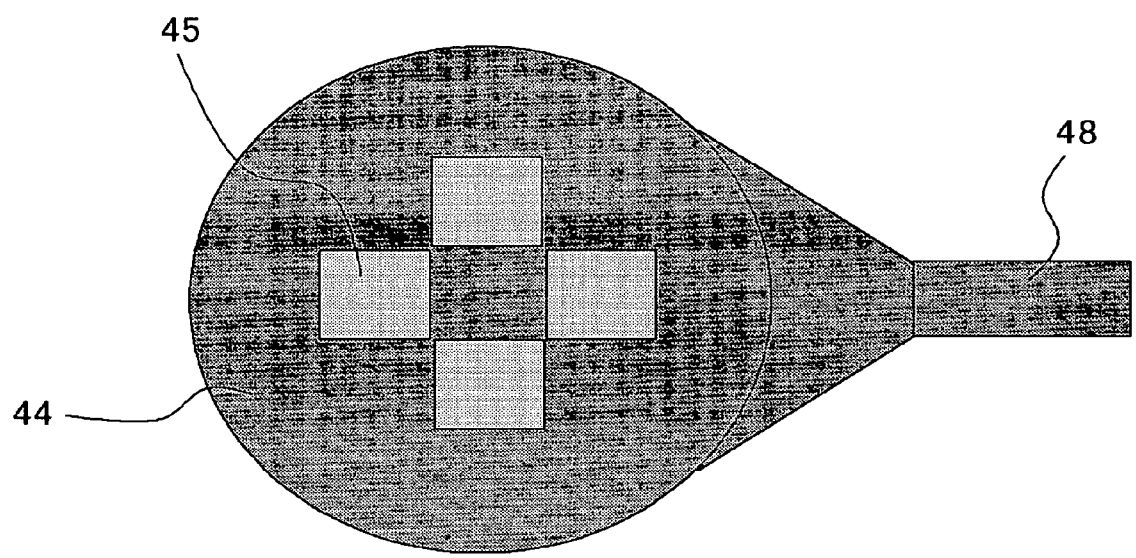
FIG. 3 is a plan view taken along the line III-III in FIG. 2.
Figure 10:
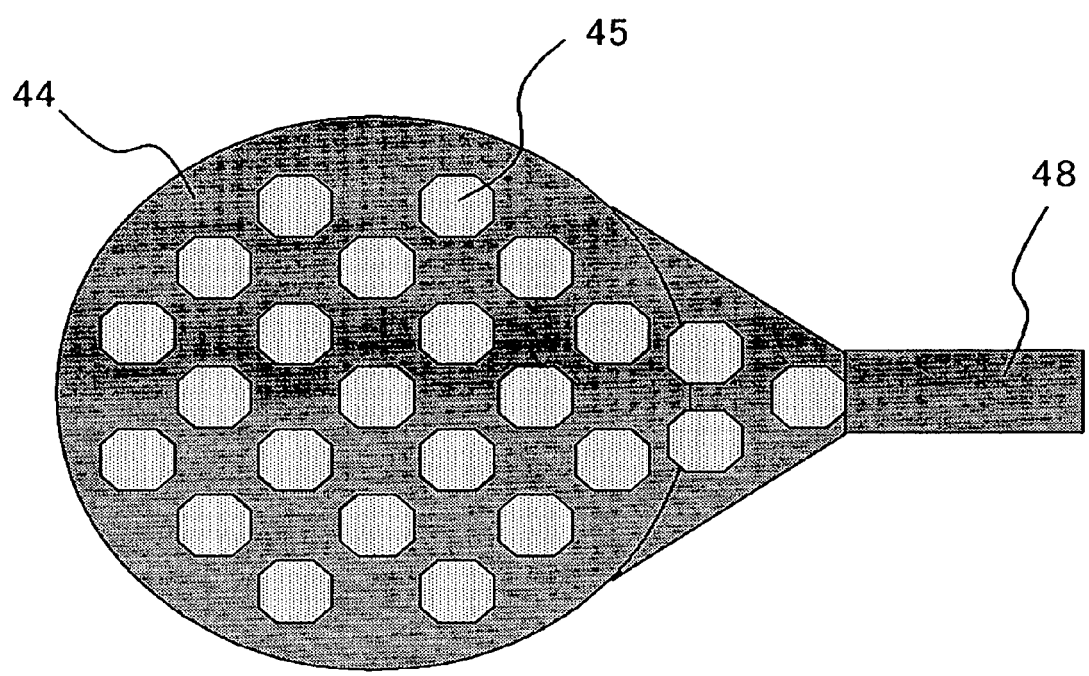
FIG. 10 is a plan view explaining a variation of the planer layout of a concave portion provided in an external electrode pad.
Figure 11:
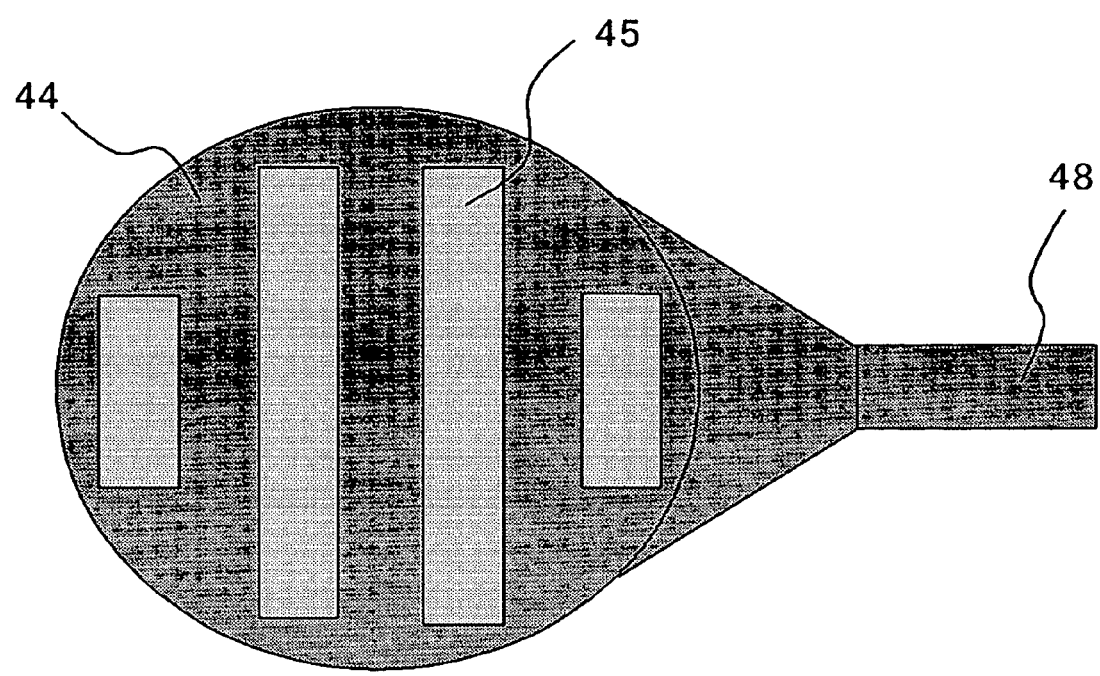
FIG. 11 is a plan view explaining a variation of the planer layout of a concave portion provided in an external electrode pad.
Figure 12:
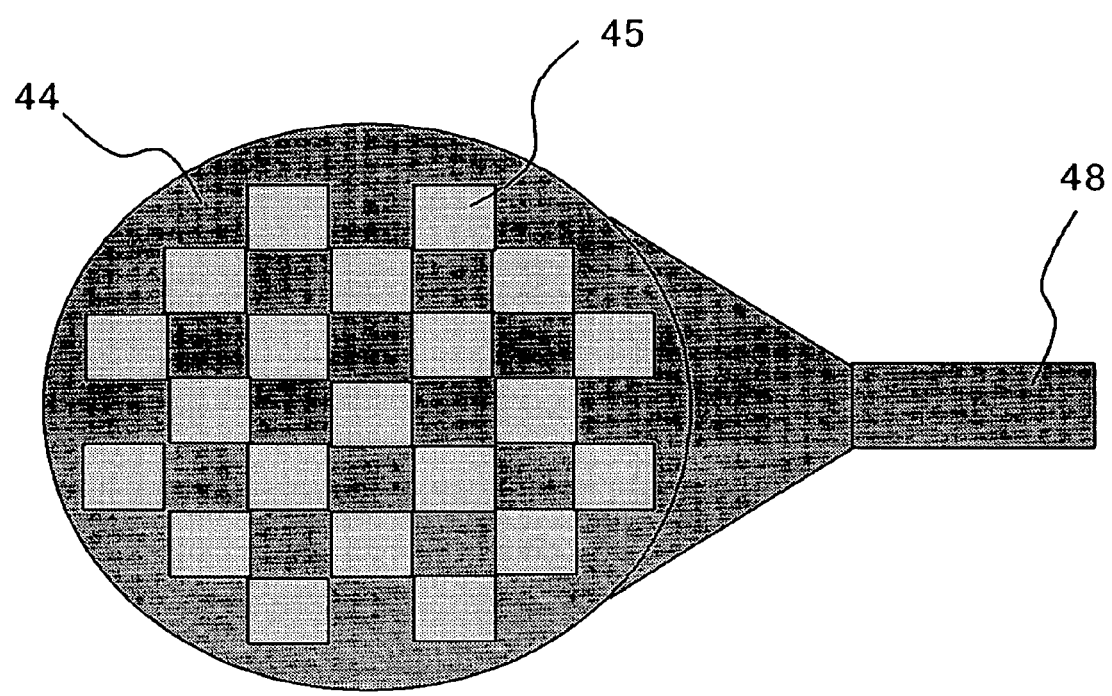
FIG. 12 is a plan view explaining a variation of the planer layout of the concave portion provided in the external electrode pad.
Figure 13:
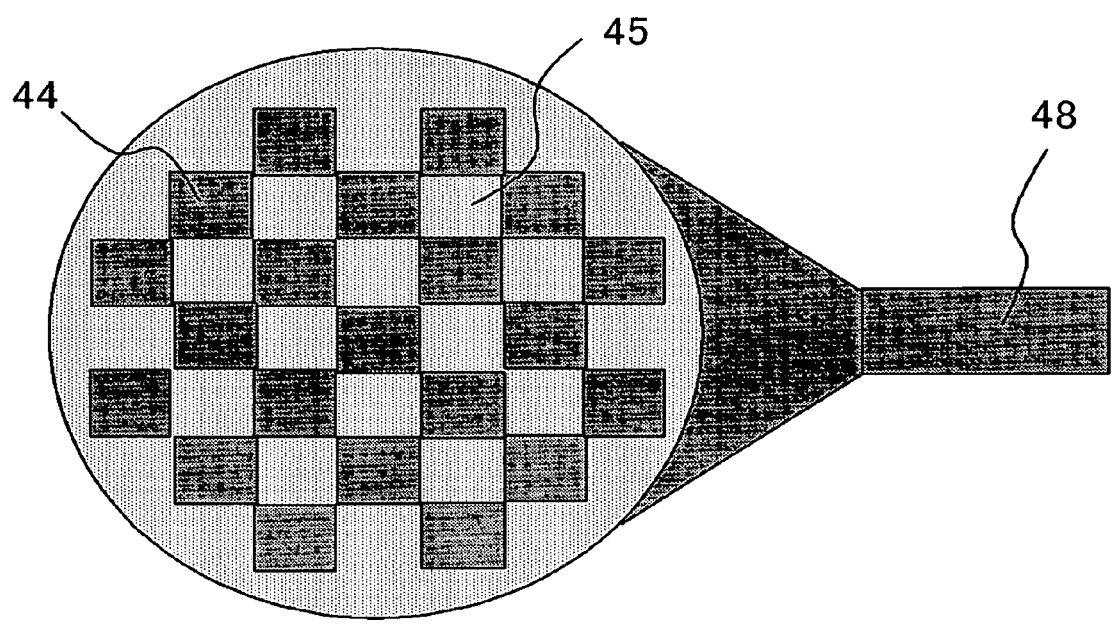
FIG. 13 is a plan view explaining a variation of the planer layout of the concave portion provided in the external electrode pad.
Figure 14:
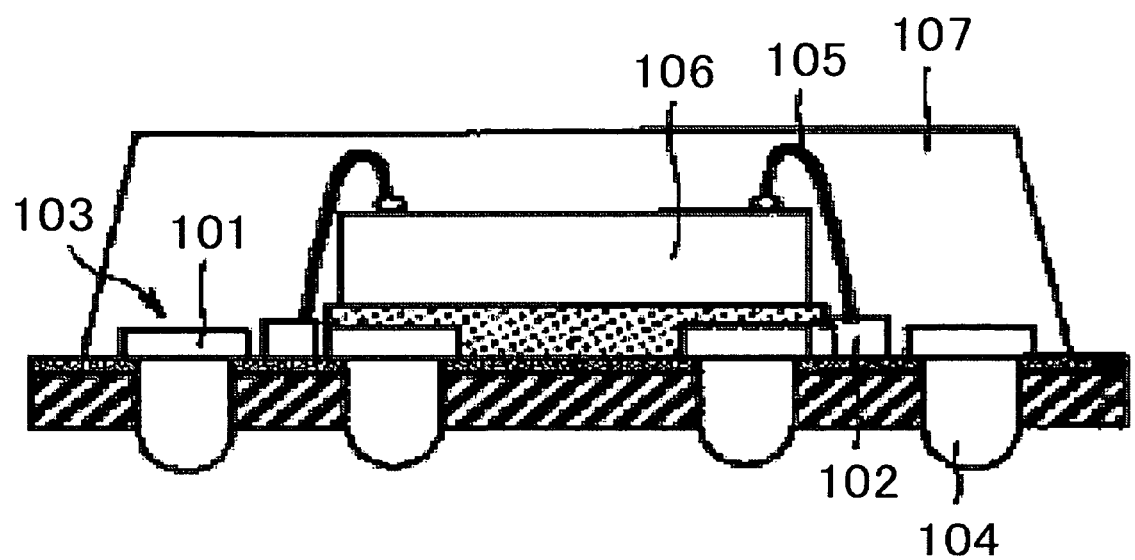
FIG. 14 is a cross-sectional view showing a conventional semiconductor device.

Moreover, the planer layout of the concave portion 45 is not limited to that of FIG. 3, and various kinds of planer layouts may be possible. For example, a round concave portion 45 may be arranged in the form of the diagonal lattice as shown in FIG. 10. Or, trench-like concave portions 45 extending in one direction are arranged along a direction approximately vertical to the extending direction as shown in FIG. 11. Or, the concave portions 45 may be arranged so that the upper pad metal layers 44 and the portion 45 form a mosaic pattern as shown in FIGS. 12 and 13. Even in this case, it may be said that the concave portions 45 are arranged like the diagonal lattice. Here, FIG. 13 is obtained by inverting the pattern in FIG. 12, that is, the upper pad metal layers 44 in the pattern of FIG. 12 are inverted to the concave portions 45 in the pattern of FIG. 13, and the concave portions 45 in the pattern of FIG. 12 are inverted to the upper pad metal layers 44 in the pattern of FIG. 13.

It is apparent that the present invention is not limited to the above embodiment, and may be modified and changed without departing from the scope and spirit of the invention.

What is claimed is:

1. A semiconductor device, comprising:

a resin layer formed on a semiconductor chip;
an insulating layer provided on said resin layer; and
an external electrode pad extending through said insulating layer, said external electrode pad comprising:
  a first surface for connecting to an external electrode terminal;
  a second surface including a concave portion, said resin layer being formed in said concave portion;
  a first conductor pattern comprising said first surface, said first conductor pattern having a thickness that is almost equal to a thickness of said insulating layer, said first conductor pattern formed in said insulating layer such that said first surface is coplanar with a surface of said insulating layer; and
  a second conductor pattern comprising said second surface.

2. The semiconductor device according to claim 1, wherein said second conductor pattern is provided in said resin layer, and
  wherein said concave portion is provided in said second conductor pattern.

3. The semiconductor device according to claim 1, wherein a third conductor pattern is provided between said first and second conductor patterns.

4. The semiconductor device according to claim 1, wherein a depth of said concave portion is approximately equal to a thickness of said second conductor pattern.

5. The semiconductor device according to claim 1, wherein said second conductor pattern has a multilayer structure including a plurality of metal layers having different compositions from each other.

6. The semiconductor device according to claim 5, wherein said multilayer structure comprises:
  a first metal layer; and
  a second metal layer provided on a surface of said first metal layer which is opposite to said first conductor pattern,
  wherein a first opening is provided in said first metal layer and a second opening is provided in said second metal layer, such that said first and second openings are continuously provided to form said concave portion, and
  wherein an opening area of said first opening is larger than an opening area of said second opening.

7. The semiconductor device according to claim 6, wherein said first metal layer comprises a Cu layer,
  wherein said second conductor pattern is provided in said resin layer,
  wherein said concave portion is provided in said second conductor pattern, and
  wherein said second metal layer comprises a Ni layer.

8. The semiconductor device according to claim 1, wherein said first conductor pattern includes a multilayer structure including a plurality of metal layers having different compositions from each other.

9. The semiconductor device according to claim 8, wherein said multilayer structure of said first conductor pattern comprises:
  a Cu layer; and
  a Ni layer provided on a surface of said Cu layer which is facing said second conductor pattern.

10. The semiconductor device according to claim 1, wherein almost all side surfaces of said first conductor pattern are covered with said insulating layer, and
  wherein almost all surfaces of said first conductor pattern, which is opposite to said second conductor pattern, are exposed in said insulating layer.

11. The semiconductor device according to claim 1, wherein an opening area of said concave portion is smaller than that of a bottom area of said concave portion.

12. The semiconductor device according to claim 1, wherein a plurality of said concave portions is provided in said external electrode pad.

13. The semiconductor device according to claim 12, wherein said plurality of concave portions is regularly arranged in a plan view.

14. The semiconductor device according to claim 1, wherein said resin layer comprises one of a sealing resin and an underfill resin.

15. The semiconductor device according to claim 1, wherein an interconnect is formed in a layer comprising said second conductor pattern, said interconnect connected to said second conductor pattern, and
  wherein an electrode bump is formed on said interconnect, said electrode bump connecting to an electrode terminal of said semiconductor chip.

16. The semiconductor device according to claim 15, wherein said interconnect comprises a multilayer structure including a plurality of metal layers having different compositions from each other.

17. The semiconductor device according to claim 16, wherein said multilayer structure of said interconnect comprises:
  a Cu layer formed on one of said first conductor pattern and said insulating layer; and
  a Ni layer formed on a surface of said Cu layer opposite to said first conductor pattern and said insulating layer.

18. The semiconductor device according to claim 1, wherein said second conductor pattern has a multilayer structure, said multilayer structure comprising:
  a first metal layer; and
  a second metal layer provided on a surface of said first metal layer that is opposite to said first conductor pattern and having a composition that is different than said first metal layer.

19. The semiconductor device according to claim 1, wherein a plurality of openings are continuously provided in said second conductor pattern to form said concave portion.
  wherein an opening area of said first opening is larger than an opening area of said second opening.

20. The semiconductor device according to claim 18, wherein said second conductor pattern comprises a Cu layer and an Ni layer.

* * * * *